Oct. 13, 1970 C. S. ANANIADES 3,534,237

POWER ISOLATION OF INTEGRATED CIRCUITS

Filed Jan. 21, 1969 2 Sheets-Sheet 1

INVENTOR.
CONSTANTINE S. ANANIADES
BY
Christie, Parker & Hale
ATTORNEYS

Oct. 13, 1970 C. S. ANANIADES 3,534,237

POWER ISOLATION OF INTEGRATED CIRCUITS

Filed Jan. 21, 1969 2 Sheets-Sheet 2

United States Patent Office
3,534,237
Patented Oct. 13, 1970

3,534,237
POWER ISOLATION OF INTEGRATED CIRCUITS

Constantine S. Ananiades, Pasadena, Calif., assignor to Burroughs Corporation, Detroit, Mich., a corporation of Michigan Filed Jan. 21, 1969, Ser. No. 792,350
Int. Cl. H01l 19/00
U.S. Cl. 317—235 4 Claims

ABSTRACT OF THE DISCLOSURE

An integrated circuit chip having a P type substrate region and N, P and N+ type regions on the substrate forming a transistor driver for applynig drive signals to a drive line. A further P type region, isolated from substrate, forms a resistor coupled between the P type region and the substrate. A further N+ type region is in the substrate and a conductor connects the further N+ type region to a source of negative potential. The further N+ type region forms a diode which isolates the drive line from the negative source of potential for predetermined excursions of potential on the drive line when the output of the negative source of potential raises to zero potential.

BACKGROUND OF THE INVENTION

Field of the invention

This invention relates to electronic circuits for digital computers and, more particularly, to integrated circuits.

Description of the prior art

Many times it is desirable to provide a number of different signal drivers and signal receivers all connected to a common transmission line. Each of the drivers and receivers act independently of the other drivers and receivers connected to the transmission line. In order to improve the reliability of the system, it is desirable that, should power to one of the drivers fail, signal transmission on the transmission line by the other drivers be not affected. In other words, it is desirable that the driver (to which power failed) isolate itself from the transmission line so that the rest of the system can continue operating properly.

In conventional discrete component circuits this problem can be alleviated by properly inserting isolation diodes or properly selecting transistor driving circuits which will isolate the driver from the transmission line when power in the driver fails.

However, it is also desirable to implement such driver circuits using integrated circuit techniques. The problem of isolating the driver from the transmission line during power failure using integrated circuit techniques poses a serious problem which heretofore has not been solved. The problem is created because of the common substrate upon which integrated circuits are constructed. The integrated circuit substrate or the base material upon which the integrated circuit is made is normally returned to the most negative source of potential in the circuit. A transistor driver constructed on the substrate causes a diode to be inherently formed between the collector of the transistor and the substrate. If the collector is connected to the transmission line and the negative source of potential fails, rising to ground potential, the inherently formed diode will form a clamp and prevent other drivers from generating the required negative signals on the transmission line.

SUMMARY OF THE INVENTION

The foregoing problems are overcome in accordance with the present invention by providing an integrated circuit diode isolation circuit between the negative source of potential and the substrate of the integrated circuit. In a unique and preferred embodiment of the present invention a high threshold voltage breakdown diode is formed between the substrate and the isolation diode in order to alleviate substrate-isolation region breakdown problems and reduce power dissipation for other circuits in the driver.

DESCRIPTION OF THE PREFERRED EMBODIMENT

Figure 1:
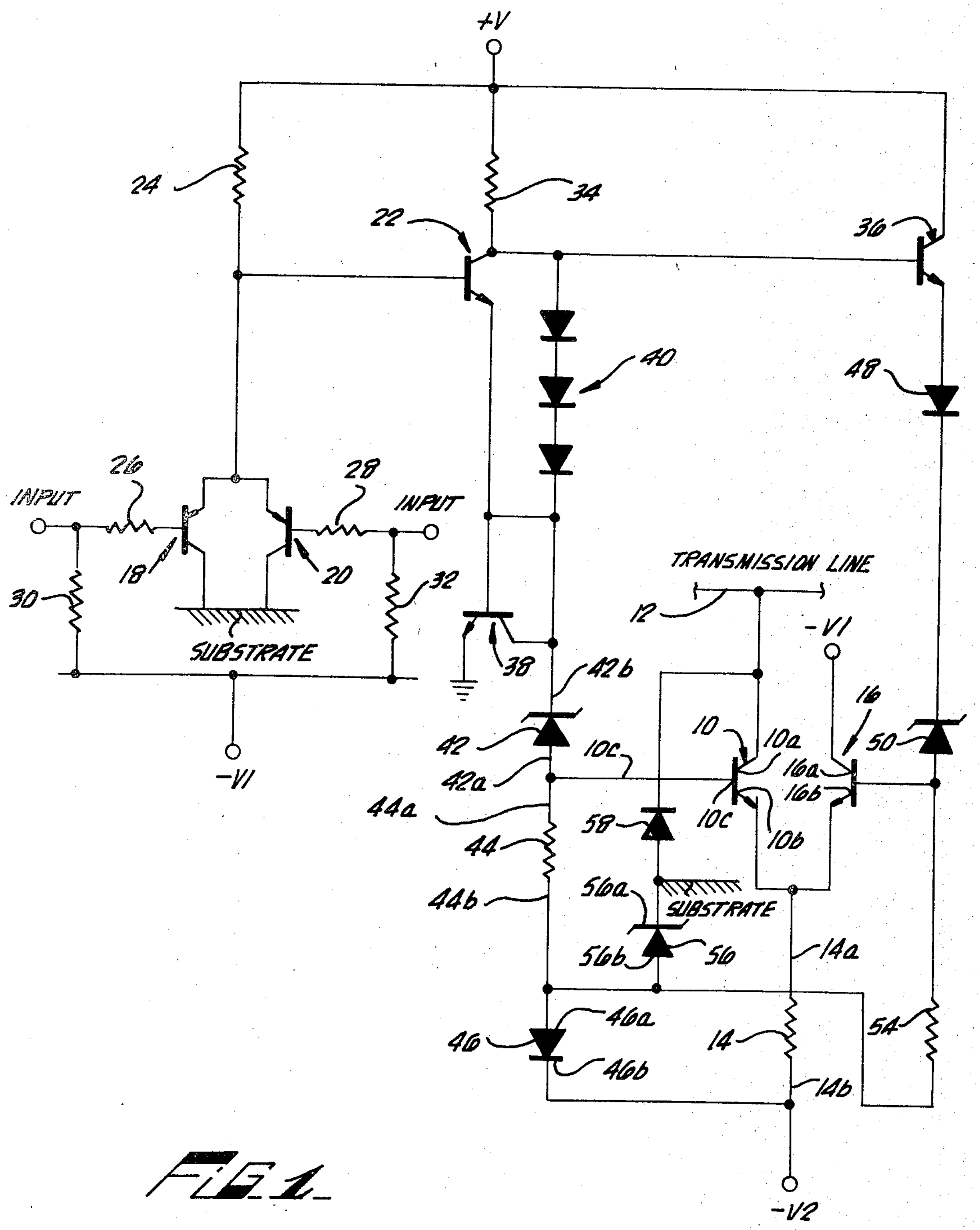
FIG. 1 is a schematic diagram of a driver circuit and embodying the present invention.

Consider the current driver circuit shown in FIG. 1 and embodying the present invention. The current driver of FIG. 1 is especially designed for construction using integrated circuit techniques. The current driver includes an output transistor 10 having its collector electrode 10*a* connected to a transmission line 12 and an emitter electrode 10*b* connected through an impedance or resistor 14 to a negative source of potential —V2.

The current driver provides an output signal which varies between zero and a negative output current. To this end, the output transistor 10 is an NPN type transistor.

A control transistor 16 is provided and is an NPN type transistor having a collector electrode 16*a* connected to a negative source of potential —V1 and its emitter electrode 16*b* connected in common to the emitter 10*b* of the transistor 10. A transistor AND gate controls the output transistor 10 indirectly through the control transistor 16. The transistor AND gate includes a pair of PNP transistors 18 and 20 having emitter electrodes connected in common to the base electrode of a transistor 22 and through a resistor 24 to a positive source of potential +V and having collector regions as part of the substrate of the integrated circuit chip. The base electrodes of the transistors 18 and 20 are connected through resistors 26 and 28 to input terminals for the driver circuit. The junctions between the resistors 26 and 28 and the input terminals are connected to the negative source of potential —V1 through biasing resistors 30 and 32.

The collector electrode of the transistor 22 is connected through a resistor 34 to the +V source of potential and to the base electrode of a transistor 36. The emitter electrode of the transistor 22 is connected to the base electrode of a transistor 38. Three diodes 40 are connected in series between the junction of the transistors 22 and 36 and the base and the collector electrodes of the transistor 38.

The junction between the transistor 38 and one of the diodes 40 is connected through the cathode to anode electrodes of a Zener or high threshold voltage breakdown diode 42 to the base electrode 10*c* of the output transistor 10. The anode 42*a* of the diode 42 and the base electrode 10*c* of the transistor 10 are connected to the terminal 44*a* of a resistor 44. A terminal 44*b* of the resistor 44 is connected to the anode 46*a* of a diode 46. The cathode 46*b* of the diode 46 is connected to a —V2 source of potential.

The collector electrode of the transistor 36 is connected to the +V source of potential and the emitter electrode is connected through the serial connection of diodes 48 and 50 and resistor 54 to the —V2 source of potential. The anode of diode 50 is connected to the base electrode of the control transistor 16.

In operation, when a high potential is applied to both inputs biasing both transistors 18 and 20 into a non-conductive condition, the base electrode of the transistor 22 rises biasing it into a conductive condition. The circuit between the base of the output transistor 10 and the base of the control transistor 16 is symmetrical up to the cathode of the Zener diodes 42 and 50. Accordingly, the voltages applied to the cathodes of the diodes 42 and 50 determine whether the transistor 10 or the transistor 16 is biased into conduction. Transistor 36 is always in conduction. With the transistor 22 also in conduction, the voltage drop from collector to emitter of the transistor 22 is approximately equal to or less than that between the base and emitter of transistor 36. As a result, the diode 48 biases the cathode of the Zener diode 50 at a lower potential than that of the cathode of the Zener diode 42 causing the transistor 10 to be biased into a conductive condition and the transistor 16 into a non-conductive condition. Thus, with both of the transistors 18 and 20 in a non-conductive condition, the output transistor 10 is biased into a conductive condition applying a current pulse on the transmission line 12.

If either (or both) of the transistors 18 or 20 is (are) biased into a conductive condition, the base of the transistor 22 is biased below the potential of its emitter causing the transistor 22 to be biased into a non-conductive condition. The voltage drop between the base and emitter electrodes of the transistor 36 is approximately equal to that of one of the diodes 40. Accordingly, there is the equivalent of two diodes drop in potential between the base of the transistor 36 and the cathode of the Zener diode 50, whereas there is the equivalent of three diodes drop in potential between the base of the transistor 36 and the cathode of the Zener diode 42. The Zener diodes 42 and 50 have the same threshold voltage breakdown value. Accordingly, the base of the transistor 10 is below that of the transistor 16 causing the transistor 16 to be biased into a conductive condition and the output transistor 10 into a non-conductive condition. Thus, no current is delivered to the transmission line 12.

Consider now carefully the diodes 56, 58 and 46. The diode 46 individually and in combination with the diodes 56 is important to the invention in providing the desired power isolation caused by a failure in power.

The diode 58 is not desired in the integrated circuit of FIG. 1, but is inherently present due to the inherent nature of the construction of the circuit using integrated circuit techniques. Stating it differently, the diode 58 is connected between the collector electrode **10*a* and the substrate of the integrated circuit and is poled with its cathode connected to the collector electrode 10*a*. Normally the substrate of an integrated circuit is connected to the most negative source of potential used in the circuit. The diode 58 (in the absence of the diode 56 and with diode 46 shorted out) clamps the collector electrode 10*a* of the transistor 10 so that it cannot drop any more than approximately ½ volt below that of the substrate. As a result, should the —V2 source of potential be connected to the substrate and fail rising to approximately 0 volts potential, the inherent diode 58 would clamp the transmission line 12 and prevent other drivers in the system from applying desired negative voltage signals to the transmission line 12**.

In accordance with the present invention the diode 46 is added, connected between the —V2 source of potential and the substrate. Note the effect of the diode 46. Under normal operating conditions the diode 46 is forward biased and has no effect on the circuit. However, should the —V2 source of potential fail and rise to approximately 0 volt potential, the diode 46 would effectively isolate the —V2 source of potential from the transmission line 12. For example, should the output of the —V2 source of potential drop to zero and should another driver (connected to the transmission line 12) apply a negative potential to the transmission line 12, the diode 46 would be reverse biased and, in effect, present an open circuit between the —V2 source of potential and the transmission line 12 via the substrate. Similarly, the emitter to base junction of the transistor 10 would be reverse biased and present an open circuit through the series connection between the transmission line 12 and the —V2 source of potential via the resistor 14.

Additionally, it is desired to reduce the voltage drop across the input transistors 18 and 20. If the substrate is connected to the —V2 source of potential it causes a high voltage drop across the transistors 18 and 20 and, as a result, high power dissipation therein. Additionally, when the substrate is connected to the —V2 source of potential there is a possibility of a voltage breakdown between the integrated circuit resistors 44, 34 and 24 or the input to the circuit or the collectors of transistors 10 and 36 and the substrate. Thus, it is desired to raise the potential of the substrate closer to ground potential than the output of the negative source of potential —V2. To this end, and of importance considered together with the construction of the diode 46, a Zener diode 56 is provided and is connected between the anode of the diode 46 and the substrate, rather than providing a direct electrical connection.

Figure 2:
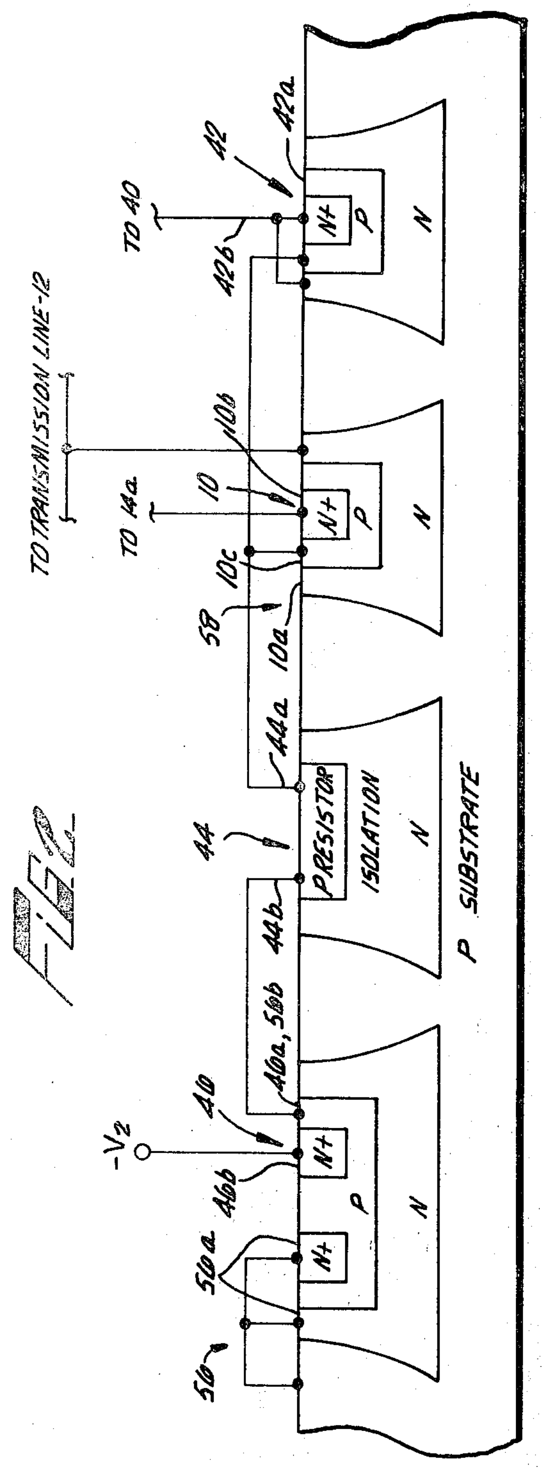
FIG. 2 is a cross-sectional view of a portion of the integrated circuit chip containing the driver circuit of FIG. 1 and embodying the present invention.

Refer now to the portion of the integrated circuit chip shown in FIG. 2. The integrated circuit chip of FIG. 2 shows a cross-sectional view of the integrated circuit chip containing the diodes 46, 56, 42, 58, the resistor 44, and the transistor 10. Note that the transistor 10 is formed of an NPN combination of integrated regions upon the P substrate region material. Also note that the resistor 44 is formed of a P type region embedded in an N type region on the P substrate material for isolation purposes. The Zener diode 42 is formed by a combination of N, P and N regions on the P substrate with the two N type regions connected together to form the cathode electrode.

Of particular interest to the present invention is the construction of the diodes 46 and 56. Note that the —V2 source of potential is connected to the P substrate through the diode 46. The Zener diode 56 is formed of an N type region placed upon the P substrate material, a P type region placed in the N type region and a further N+ type region embedded in the P region. The cathode **56*a* of the Zener diode 56** is formed in part by a conductor which interconnects the N+ region and the N region and connects them to the P substrate region.

The diode 46 is formed merely by the addition of another separate N+ type region embedded in the P type region of the diode 56. The terminal **44*b* of the resistor 44 is connected by a conductor to the anodes of diodes 46 and 56. Thus, the diodes 56 and 46 share the common P region as it provides the anode electrodes of the two diodes. This common P region is indicated by the common reference numerals 46*a*, 56*b*** which are also shown in FIG. 1.

Figure 3:
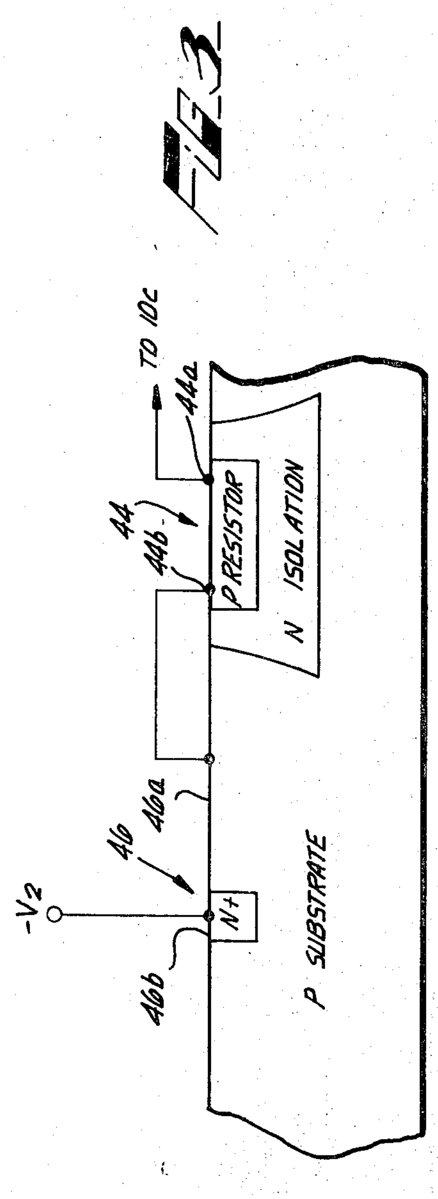
FIG. 3 is a cross-sectional view of a portion of the integrated circuit chip of FIG. 2 showing an ultimate embodiment of the invention.

Note, if it were desired to utilize only the diode 46 connecting the anode of the diode 46 directly to the substrate, and thus eliminate the Zener diode 56, the N+ region **46*b* of the diode 46 could be embedded directly into the P substrate material and the remaining N+, P and N regions of the diode 56 eliminated. Under these circumstances the P substrate material would form the anode electrode of the diode 46**. FIG. 3 is a sketch showing how the integrated circuit chip of FIG. 2 would be modified in this regard.

It should be noted that N+ regions are indicated in a number of places. The N+ region indicates a greater concentration of impurities than an N region. The purpose of using the N+ regions is to make it easier to connect metal leads to these regions. However, N regions could be used in place of the N+ regions within the scope of the present invention.

Although one example of the present invention has been shown by way of illustration, it should be understood that there are many other rearrangements and embodiments of the present invention within the scope of the following claims.

I claim:

1. In an integrated circuit chip having a substrate and N, P and N type regions on the substrate forming a transistor driver for applying drive signals to a drive line and including a further P type region isolated from said substrate forming a resistor connected between the P type region and a terminal, the improvement comprising a further N type region in the substrate and having a still further P type region therein, and a pair of separate N type regions in said still further P type region, conductive means for connecting the substrate to the further N type region and to one of said separate N type regions thereby forming a high threshold voltage breakdown diode between the substrate and the terminal, and conductive means for connecting the other separate N type region to a source of negative potential, the other separate N type region and the still further P type region forming a diode which isolates the drive line from the negative source of potential for predetermined excursions of potential on the drive line when the output of said negative source of potential raises to zero potential.

2. In an integrated circuit chip according to claim 1 wherein said substrate is a P type region.

3. In an integrated circuit chip according to claim 2 including still another N type region in said substrate having still another P type region therein and conductive means for connecting the still another P type region to said P type region, the still another N and P type regions providing a unilateral conductive device connection to said transistor.

4. In an integrated circuit chip having a P type substrate region and N, P and N type regions on the substrate forming a transistor driver for applying drive signals to a drive line and including a further P type region isolated from said substrate forming a resistor coupled between the P type region and the substrate, the improvement comprising a further N type region in the substrate and conductive means for connecting the further N type region to a source of negative potential, the further N type region forming a diode which isolates the drive line from the negative source of potential for predetermined excursions of potential on the drive line when the output of said negative source of potential raises to zero potential.

References Cited

UNITED STATES PATENTS

| | | | |
|---|---|---|---|
| 2,981,877 | 4/1961 | Noyce | 317—235 |
| 3,333,326 | 8/1967 | Thomas et al. | 317—235 |

JERRY D. CRAIG, Primary Examiner

U.S. Cl. X.R.

307—213, 303